(12) United States Patent
Mayr et al.

(10) Patent No.: US 11,996,385 B2
(45) Date of Patent: May 28, 2024

(54) APPARATUS AND METHOD FOR DETACHING A DIE FROM AN ADHESIVE FILM

(71) Applicant: Besi Switzerland AG, Steinhausen (CH)

(72) Inventors: Andreas Mayr, Radfeld (AT); Manfred Dorfer, Radfeld (AT)

(73) Assignee: BESI SWITZERLAND AG, Steinhausen (CH)

( * ) Notice: Subject to any disclaimer, the term of this patent is extended or adjusted under 35 U.S.C. 154(b) by 623 days.

(21) Appl. No.: 17/252,760

(22) PCT Filed: Jun. 24, 2019

(86) PCT No.: PCT/IB2019/055300
§ 371 (c)(1),
(2) Date: Dec. 16, 2020

(87) PCT Pub. No.: WO2020/003095
PCT Pub. Date: Jan. 2, 2020

(65) Prior Publication Data
US 2021/0265302 A1 Aug. 26, 2021

(30) Foreign Application Priority Data
Jun. 24, 2018 (DE) .......................... 102018115147.0

(51) Int. Cl.
*H01L 21/00* (2006.01)
*B65G 47/90* (2006.01)
(Continued)

(52) U.S. Cl.
CPC .......... *H01L 24/799* (2013.01); *B65G 47/902* (2013.01); *H01L 21/6838* (2013.01); *B65G 2203/0233* (2013.01)

(58) Field of Classification Search
CPC ......... H01L 21/67132; H01L 21/67144; H01L 21/6838; H01L 24/799; B65G 2203/0233; B65G 47/902
(Continued)

(56) References Cited

U.S. PATENT DOCUMENTS 6,283,693 B1  9/2001 Acello
6,440,758 B1  8/2002 Tamaishi
(Continued)

FOREIGN PATENT DOCUMENTS

DE  102006019671 A1  10/2007
DE  102009035099 A1  2/2011
(Continued)

*Primary Examiner* — Katina N. Henson
(74) *Attorney, Agent, or Firm* — HULTQUIST, PLLC; Steven J. Hultquist

(57) ABSTRACT

An apparatus 100 for releasing a die 150 with a vacuum platform 130 with two or more segments 140 is provided, which may be extended independently of the surface of the vacuum platform 130 to push against the adhesive film 110 at the respective attachment in the direction of the die gripper 170. By providing two or more segments 140 that are independently extendable, die detachment (or at least partial detachment) may be performed in parallel, and two or more dies 150 may be detached before the adhesive film 110 needs to be repositioned. Both measures may increase throughput. In addition, empty attachment positions may be omitted.

8 Claims, 5 Drawing Sheets

(51) Int. Cl.
*H01L 21/683* (2006.01)
*H01L 23/00* (2006.01)

(58) Field of Classification Search
USPC .......................................................... 269/21
See application file for complete search history.

(56) References Cited

U.S. PATENT DOCUMENTS

| | | | |
|---|---|---|---|
| 6,865,874 | B2 | 3/2005 | Straaten |
| 8,801,352 | B2 * | 8/2014 | Webb ................ H01L 21/67132 |
| | | | 414/811 |
| 2004/0026938 | A1 | 2/2004 | Junge |
| 2004/0038499 | A1 | 2/2004 | Kim |
| 2005/0224186 | A1 | 10/2005 | Sillner |

FOREIGN PATENT DOCUMENTS

| | | |
|---|---|---|
| JP | 2003109979 A | 4/2003 |
| KR | 20130022622 A | 3/2013 |

\* cited by examiner

APPARATUS AND METHOD FOR DETACHING A DIE FROM AN ADHESIVE FILM

CROSS REFERENCE TO RELATED APPLICATIONS

This application is the U.S. national stage of International Application No. PCT/162019/055300, filed on 2019 Jun. 24. The international application claims the priority of DE 102018115147.0 filed on 2018 Jun. 24; all applications are incorporated by reference herein in their entirety.

BACKGROUND

The present invention relates to an apparatus for detaching a die from an adhesive film having two or more adjacent die-sized attachment positions, a vacuum platform for detaching a die from an adhesive film, a die gripper for releasably attaching to a die on an adhesive film, and a method for detaching a first and a second die from two adjacent die-sized attachment positions on an adhesive film, and a system.

From the state-of-the-art, apparatus and components such as ejectors or vacuum platforms and methods for the use of such for the removal of semiconductor devices or components from an adhesive film are known in a sufficiently wide variety and high multitude.

For example, DE 10 2006 019 671 A1 describes a multiple bond head with two integrated independently movable die grippers, or U.S. Pat. No. 6,440,758 describing a multiple bond head with two partially independently movable die grippers with an intermediate stage and bonding stage, or U.S. 61/865,874 describing a system with a bond head and several separate die grippers which are arranged parallel to each other on a frame.

In general, the dies are typically provided on an adhesive film held by a frame, also known as tape to the skilled person, for processing on a semiconductor assembly device. The dies adhere to the adhesive film. The frame with the adhesive film is mounted on a sliding wafer table. The wafer table is moved incrementally to provide one die after the other at an attachment position, and then the provided die is detached by a gripper and placed on a substrate. The removal of the provided die from the adhesive film by means of a die gripper is supported by a die ejector, located below the adhesive film (also known as a die remover, chip ejector or chip removal device to the skilled person), whereby the adhesive film rests on a table. The table includes a vacuum platform with a variety of holes to support the adhesive film during the die removal process and to hold it in place using vacuum.

Die-ejectors must be able to repeatedly detach dies from the adhesive tape under a wide range of conditions. The throughput of such an apparatus is one of the most critical parameters. Even small improvements offer the operator of the apparatus a considerable process acceleration, shorter assembly times and thus economic advantages.

SUMMARY

A die-ejector apparatus must repeatedly detach dies from adhesive films under various conditions. The throughput of such an apparatus is one of the most critical parameters and even small improvements offer a significant economic advantage to the operator of such an apparatus.

An apparatus 100 for releasing a die 150 with a vacuum platform 130 with two or more segments 140 is provided, which may be extended independently of the surface of the vacuum platform 130 to push against the adhesive film 110 at the respective attachment in the direction of the die gripper 170.

By providing two or more segments 140 that are independently extendable, die detachment (or at least partial detachment) may be performed in parallel, and two or more dies 150 may be detached before the adhesive film 110 needs to be repositioned. Both measures may increase throughput. In addition, empty attachment positions may be omitted.

DETAILED DESCRIPTION

An object of the invention is to provide a machine with a die ejector with an increased throughput, whereby the machine is given sufficient flexibility through the die ejector to react to variations in the die feed path.

In a first aspect of the invention, a so-called ejector device, also known as an ejector or detachment device is provided. The apparatus for detaching a die from an adhesive film has two or more adjacent die-sized attachment positions, and comprises a vacuum platform, having a surface for supporting and holding the adhesive film on which the die is disposed, and a die gripper, such as a clamping gripper or a suction member, for releasably attaching to dies, the vacuum platform comprising two or more segments which are independently extendable relative to the surface of the vacuum platform to push against the adhesive film at the respective attachment position towards the die gripper, and thereby detach (remove) or eject the die from the attachment on the adhesive film. The apparatus further comprises a die detector, configured to detect the attachment at which the die is mounted, a controller configured to extend the segment near the attachment to push the die towards the die gripper, and further configured to move the die gripper to attach to or to catch the die. Whether a matter of detachment, attachment and gripping or ejection and collection substantially depends on the adhesive strength of the adhesive film and the speed at which it is extended and the force applied to the segment extending in each case which, according to the invention, are tunable to each other specifically to further increase throughput.

In an aspect of the invention, the controller is also configured to distinguish from a provided wafer mapping showing occupied and empty attachment positions, and/or from die-detector information showing empty and occupied attachment positions and occupied positions with defective dies, in order to skip attachment positions.

By providing a vacuum platform with two or more segments that are independently extendable, die detachment (or at least partial die detachment) may be performed in parallel, and two or more dies may be detached before the adhesive film has to be repositioned. Both measures may increase throughput.

In an aspect of the invention, the adhesive film has four attachment positions and the vacuum platform has four segments, each of which may be extended independently to push against the adhesive film at the respective attachment position. By providing four segments, four die-size attachment positions are created, allowing further increase in throughput and more flexibility in skipping empty attachment positions.

In an aspect of the invention, the vacuum platform also has two or more pistons, each piston configured to extend each segment independently towards the die gripper.

In an aspect of the invention, the vacuum platform comprises four pistons, each of which is configured to extend each segment independently in the direction of the die gripper.

In an aspect of the invention, the vacuum platform further comprises a piston, configured to extend the two or more segments towards the die gripper, and a selector, configured to select one or more segments by resisting displacement or allowing displacement of one or more pistons. Each piston may be preloaded in one direction (downwards) and the respective openings determine which pistons remain in position and which pistons are pushed in the opposite direction to the preload.

In an aspect of the invention, the selector comprises a rotatable plate having one or more openings, arranged and configured to select one or more segments by rotating the rotatable plate so that the pistons extend the remaining segments due to the one or more openings.

The pistons aligned with the rotary plate are selected by resistance to this displacement. It is also possible to construct it the other way around by prestressing the pistons upwards, so that by aligning an opening each piston may be pushed upwards, i.e. selected. The rotating plate would then resist a displacement—to select certain pistons by not sliding upwards.

In an aspect of the invention, the selector is configured to resist the movement of one segment, preferably two or three segments, in the direction of the die gripper.

In an aspect of the invention, the die gripper has two or more die gripper heads, with each die gripper head being movable to attach to a die at the respective attachment position. With two or more die gripper heads, two or more dies may be simultaneously detached and moved to another location within the apparatus. This may additionally increase the throughput.

In an aspect of the invention, the die gripper has four die gripper heads, with each die gripper head being movable to attach to a die at the respective attachment position.

In another aspect of the invention, a vacuum platform is provided. The vacuum platform for releasing a die from an adhesive film having two or more adjacent die-sized attachment positions, has a surface for supporting and holding the adhesive film on which the die is disposed; wherein the vacuum platform has two or more segments which are independently extendable relative to the surface of the vacuum platform to push against the adhesive film at the respective attachment position away from the surface of the vacuum platform.

The vacuum platform with the two or more independently extendable segments may be used to improve the throughput of existing die removal devices.

In another aspect of the invention, a die gripper is provided for the releasable attachment to a die. The die gripper for releasably attaching to a die, on an adhesive film having two or more attachment positions, has two or more die gripper heads, the die gripper heads being independently operable to attach to a die at the respective attachment position, and the two or more attachment positions being adjacent and die-sized.

In a further aspect of the invention, a method is provided to detach a first and a second die from two adjacent die-sized attachment positions on an adhesive film. The method of detaching a first and a second die from two adjacent die-sized attachment positions on an adhesive film comprises:
  providing a die gripper for releasably attaching to the first and the second die;
  supporting and holding the adhesive film on a surface of a vacuum platform, the vacuum platform comprising two or more segments independently extendable relative to the surface of the vacuum platform to push against the adhesive film at different attachment positions towards the die gripper.

The method also includes:
extending the segment proximate the attachment position at which the first die is located to push the first die towards the die gripper;
placing the die gripper on the first die;
removing the first die from the adhesive film;
holding the adhesive film on the surface of the vacuum platform;
detecting the attachment position at which the second die is arranged;
extending the segment proximate the attachment position at which the first die is arranged to push the first die towards the die gripper;
placing the die gripper on the second die;
removing the second die from the adhesive film.

In an aspect of the invention, the process also includes detection of the attachment position at which the first die is arranged, as an additional process step.

In an aspect of the invention, the method further comprises distinguishing, as an additional method step, from a provided wafer mapping showing occupied and empty attachment positions, and/or from die-detector information showing empty and occupied attachment positions and occupied positions with defective dies, in order to skip attachment positions.

According to the invention, all the aforementioned devices, namely the apparatus for detaching dies from an adhesive film, the vacuum platform and the die gripper, may interact in a system for equipping electronic assemblies with semiconductor components, and the system may carry out the method.

BRIEF DESCRIPTION OF THE DRAWINGS

Further advantages and characteristics of the invention result from the following figures, namely.

DETAILED DESCRIPTION OF THE PREFERRED EMBODIMENTS

Figure 1A:
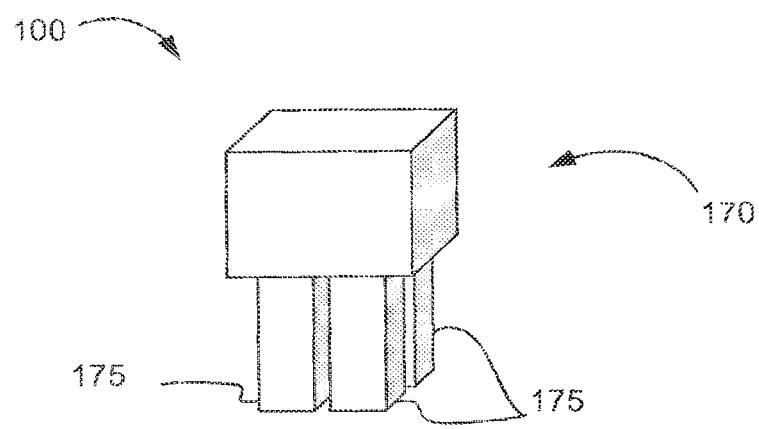
FIGS. 1A, 1B, and 1C show the main components of an apparatus for detaching a die.
Figure 1B:
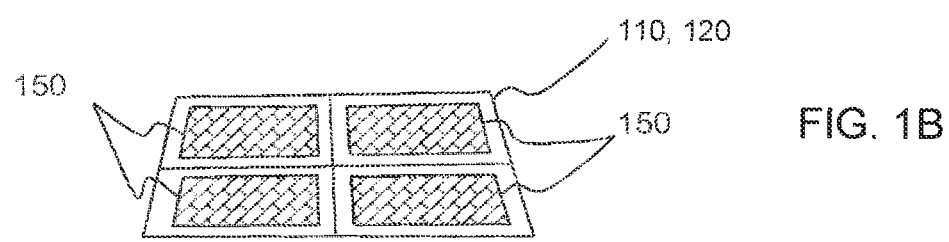
Figure 1C:
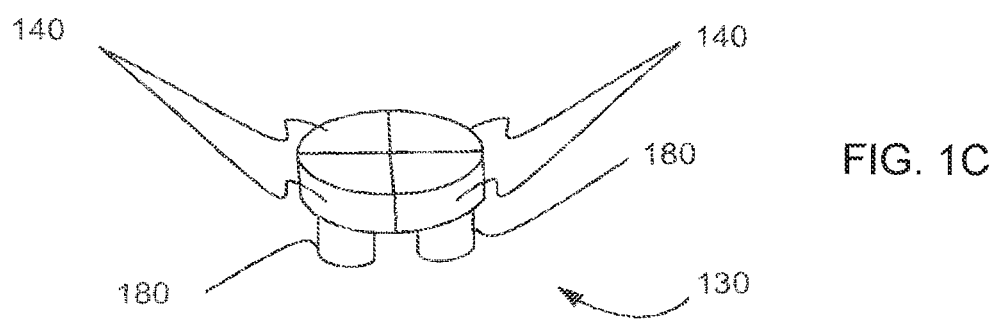

FIGS. 1A, 1B, and 1C show the main components of an apparatus 100 for releasing a die 150 from an adhesive film 110. The apparatus 100 comprises a vacuum platform 130 for supporting and holding the adhesive film 110; and a die gripper 170 for releasably attaching to the die 150.

Typically, a wafer comprising a plurality of semiconductor dies 150 is applied to the adhesive film 110 during separation, with each die 150 being separated while adhering to the adhesive film 110. Removing a die 150 from an adhesive film 110 is a common process in die bonding and flip die bonding for the assembly of electronic assemblies.

The adhesive film 110 depicted consists of two or more adjacent, die-sized attachment positions 120—each attachment position 120 may be occupied by a die 150. The number of attachment positions in an apparatus 100 for removing a die corresponds to the maximum number of dies 150 that may be removed without repositioning the adhesive film 110. The apparatus 100 depicted in FIGS. 1A, 1B, and 1C for removing a die has four adjacent attachment positions 120.

The vacuum platform 130 is configured to hold the adhesive film 110 in position by vacuum when the dies 150 are detached from the adhesive film 110. The vacuum platform 130 has two or more segments 140, which may be extended against the adhesive film 110 at the respective attachment position 120 in the direction of the die gripper 170 independently of the surface of the vacuum platform 130. Each segment 140 is configured and arranged so that after positioning the adhesive film 110 on the vacuum platform 130, it is aligned with a corresponding attachment position 120.

For example, segments 140 may be needle segments. Preferably they are compatible with conventional 8k8 die ejectors.

The vacuum platform 130 shown in FIG. 1C has four segments 140, one segment for each of the adjacent attachment positions 120, so that up to four dies 150 may be detached without having to reposition the adhesive film 110. Each segment 140 is preferably dimensioned in such a way that it makes up at least half, preferably more than half, of the area of a die 150.

Conventional apparatus have only one attachment position 120, so the 110 adhesive film must be repositioned before each die 150 is ejected. By providing a vacuum platform 130 with two or more independently extendable segments 130, two or more dies 150 may be ejected without repositioning the adhesive film 110. According to the invention, this improves the throughput of the apparatus 100 for detaching dies.

The vacuum platform 130 is configured and arranged to interact with a die gripper 170. As the dies 150 are removed, one or more segments 140 at each attachment position, push against the adhesive film 110 towards the die gripper 170. The die gripper 170 includes one or more die gripper heads 175 to releasably attach to a die 150 at one or more attachment positions 120.

The apparatus 100 for detaching a die may be operated according to the following method:
- the adhesive film 110 is brought into contact with the surface of the vacuum platform 130;
- vacuum is applied to keep the adhesive film 110 stable on the surface of the vacuum platform 130;
- the adhesive film 110 comprises two or more die-sized attachment positions 120, and may comprise two or more dies 150;
- the segment 140 aligned with the first attachment position 120 is extended relative to the surface of the vacuum platform 130 to push against the adhesive film 110 in the direction of the die gripper 170. In practice, the surface of the vacuum platform 130 may lie in a horizontal plane so that the segment 140 moves along the Z axis or upwards;
- the die 150 at the first attachment position 120 (the first die 150) is detached, and the first die 150 attached to by the die gripper head 175;
- the die gripper head 175 moves away from the attachment positions 120 and places the first die 150 at a different position. Preferably, the apparatus 100 for detaching a die also includes the functionality of a bond head, which makes it possible to mount the dies 150 after detachment. The apparatus 100 may also preferably include a flip unit, picking and/or placement functionality;
- the die gripper head 175 moves to the second attachment position 120;
- the segment 140 aligned with the second attachment position 120 is extended relative to the surface of the vacuum platform 130 to push against the adhesive film 110 in the direction of the die gripper 170;
- the die 150 at the second attachment position 120 (the second die 150) is detached, and the second die 150 is attached to by the die gripper head 175;
- the die gripper head 175 moves away from the attachment positions 120 and places the second die 150 at a different location;
- the adhesive film 110 is repositioned to bring two or more die-size 120 attachment positions into contact with the surface of the vacuum platform 130.

As the skilled person will realise, using the four-position 120 configuration shown in FIG. 1B, the method described may be repeated for a third die and a fourth die without having to reposition the adhesive 110.

Instead of replacing each die 150 independently, two or more dies 150 may alternatively be replaced completely or partially at the same time, since the segments 140 may be extended independently of each other. This further increases throughput by allowing a die 150 to be removed (or partially removed) while the die gripper head 175 moves a previously removed die 150 to another location. For the example from FIGS. 1A, 1B, and 1C, the vacuum platform 130 may be configured and arranged so that one, two, three or four segments 140 may be extended simultaneously to the die gripper 170.

The die gripper 170 may include two or more die gripper heads 175 so that two or more dies 150 may be detached from the adhesive film 110 and picked up in parallel by the die gripper 170. This contributes to a further increase in throughput.

The die gripper 170 shown in FIG. 1A comprises four die gripper heads 175, each of which is configured and arranged to accommodate a die 150 at one of the four adjacent die-sized attachment positions 120. The vacuum platform 130 may also be configured and arranged to accommodate (or partially accommodate) dies 150 at the four adjacent 120 attachment positions, resulting in a large increase in throughput compared to conventional sequential machining equipment. A higher throughput is advantageous when removing dies 150 for high-speed applications such as fan-out or flip-chip.

Figure 4:
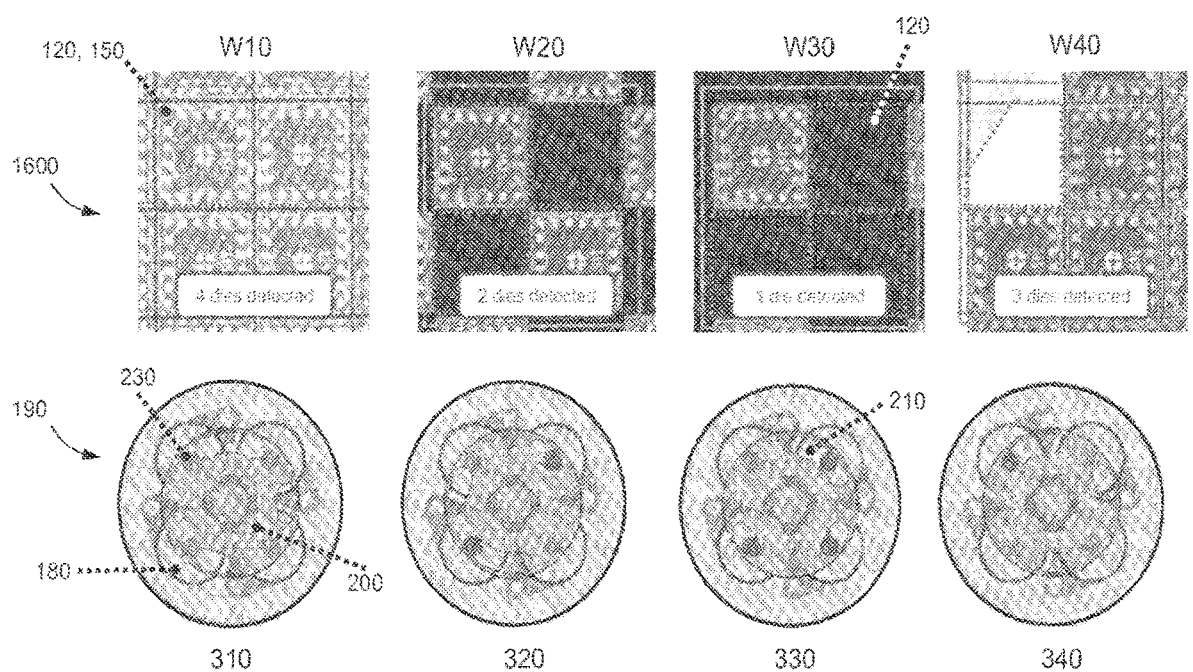
FIG. 4 shows the functionality of the selector as a function of a wafer mapping.

In practice, one or more of the die-sized attachment positions 120 may be empty or occupied by defective dies 150. This may be due to the fact that a die 150 has already been replaced as shown in FIG. 4 in wafer mapping W30, bottom right, or the dies 150 are defective or form part of the edge area of the wafer as shown in FIG. 4 in wafer mapping W40, top left. The apparatus 100 for detaching a die further comprises one or more die detectors 160 configured to detect the attachment positions 120 at which the one or more dies 150 are attached to the adhesive film. The one or more detectors 160 may be located in the vacuum platform 130 and/or in the die gripper head 175. Apparatus 100 for removing a die may also be configured not to extend a segment 140 if no die 150 is detected at the respective die-sized attachment position 120. Also, no segment 140 is extended if the die detector 160 detects a defective die 150.

Alternatively, instead of using a die detector 160, a pre-detected wafer mapping 310, 320, 330, 340 with occupied and/or unoccupied and/or defective die 150 occupied array positions or apparatus 100 data, preferably in the form of a data set, may be provided.

Alternatively, the die 100 removal device may be configured to extend a segment 140 when a die 150 is detected at the die-size attachment position. In this way, two or more 150 dies may be removed in parallel with the apparatus's operations (movements) to further increase throughput.

When pushing the adhesive film 110 with a segment 140, the adhesive film 110 may be accidentally penetrated or punctured, e.g. by excessive force. A smaller segment 140 may increase the risk of piercing the adhesive film 110. The risk may also be reduced by using a more resistant adhesive film 110.

With any suitable drive, the segments 140 may be extended independently of each other—for example by pneumatic, mechanical, electric drives or a combination of these. For example, the vacuum platform 130 may comprise one or more pistons 180—preferably one piston 180 is provided for each segment 140. Each piston 180 may also be configured to extend two or more segments 130.

In addition, a selector 190 is provided to select one or more segments 140 for extension—e.g. pneumatic valves with suitable control electronics with pneumatic pistons or suitable control electronics with electric pistons may be used.

Figure 2:
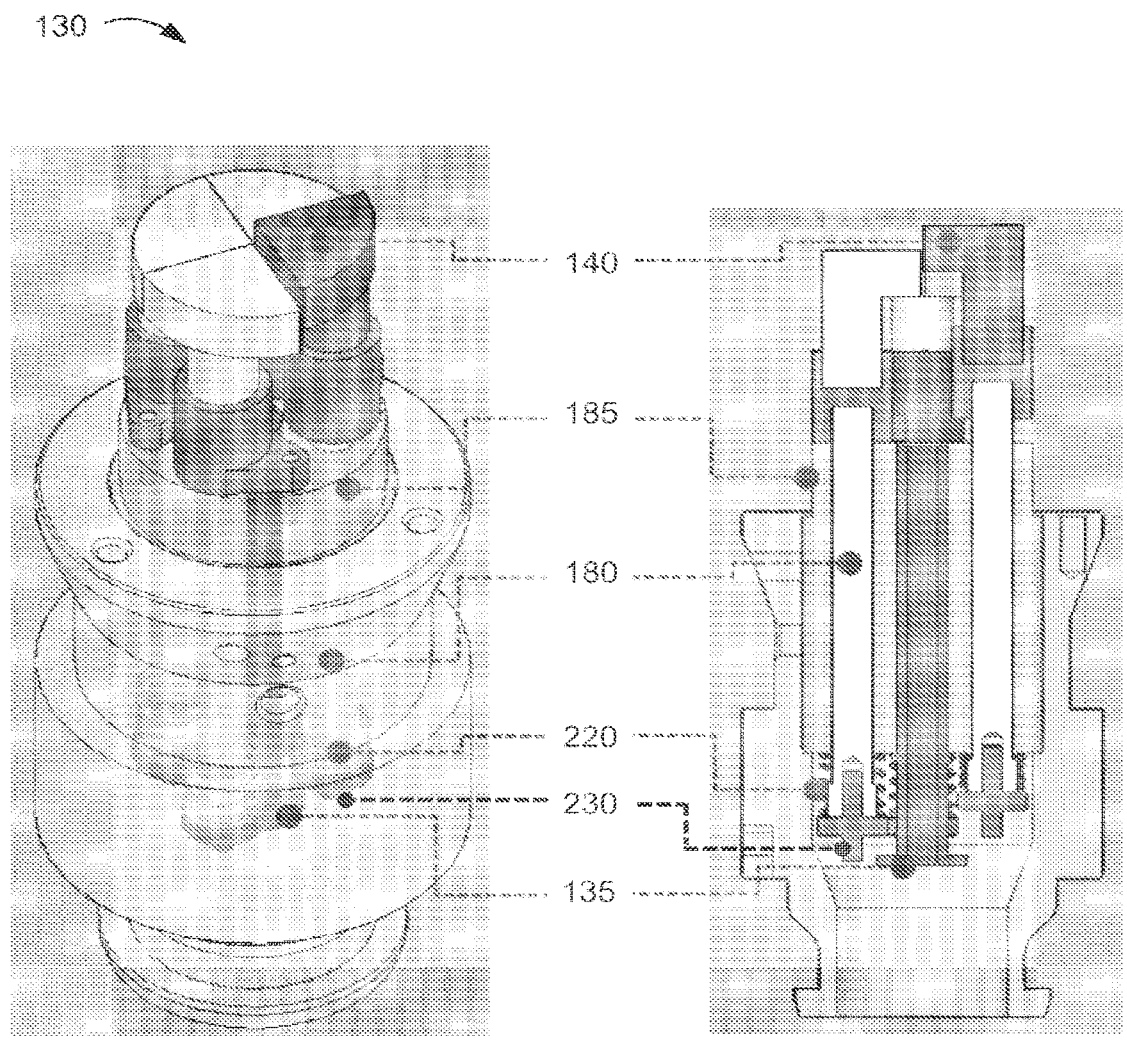
FIG. 2 shows another version of a vacuum platform.

FIG. 2 shows a further version of a vacuum platform 130—the left side of the FIG. 2 shows a perspective view and the right side of the FIG. 2 shows a vertical cross-section through the vacuum platform 130. Four segments 140 are available, each configured and arranged to extend independently of each other towards the die gripper 170 (not shown), which in this illustration represents an extension upwards. In addition, they are configured and arranged to move away independently from the die gripper 170, which in this figure represents a downward extension.

Each segment 140 is equipped with a corresponding piston 180—the segment 140 is rigidly attached to the first end of the piston 180. In this example, the pistons 180 are passive rods which cause the movement of their respective segment 140 by movement relative to a guide cylinder 185. As shown, the movement is up and down. The 130 vacuum platform also includes four compression springs 220, one for each 180 piston, and each piston 180 is biased away from the die gripper 170 by its compression spring 220. The vacuum platform 130 also includes a selector 190 (not shown) configured to select one or more segments 140 for independent extension to the die gripper 170—each segment 140 is selectable to extend all possible combinations of segments 140.

The selector 190 comprises a rotatable plate 200 (not shown) at the end of the vacuum platform 130 furthest from the die gripper 170—as shown, the rotatable plate 200 has a disc portion rotating about the vertical axis (as shown) with correspondingly configured openings 210 contacting the lower end (as shown) of each piston 180, the respective piston pin 230. When the rotatable plate is rotated, at locations where an opening 210 (as shown, directly below a piston 180) is aligned with a piston pin 230, the piston pin 230 is moved into the aligned opening by the preload of the compression spring 220 (as shown). Since segment 140 is fixed to the other end of piston 180, the segment moves away from the die gripper when opening 210 is aligned with piston pin 230 of piston 180 (as shown).

These and similar designs are advantageous because four or more 180 pistons may be actuated simultaneously and selectively with a single actuator—the rotating plate 200 may be driven (rotated) by an appropriately configured pneumatic, electric and/or mechanical actuator. Preferably an electric motor is used.

The vacuum platform 130 shown in FIG. 2 also includes a 135 vacuum supply extending from the lower end (as shown) of the 130 vacuum platform to the end near the die gripper 170. This vacuum supply 135 is suitable for holding the adhesive film 110 during die removal by the vacuum platform 130, which includes a suitable vacuum platform surface.

For reasons of clarity, this is not shown in FIG. 2, but is typically a vacuum channel surface horizontally (as shown) attached to the vacuum platform 130 at the end near the die gripper 170, the vacuum platform 130 surface being approximately the same distance from the die gripper 170 as the upper (as shown) surface of segments 140 when segments 140 are away from the die gripper 170. The surface of the vacuum platform 130 is provided with a correspondingly large opening 210 for the two or more segments 140. In other words, when an opening 210 of the rotatable plate 200 is aligned with a piston pin 230 (as shown), the upper surface of the respective segment 140 is approximately coplanar with the surface of the vacuum platform 130. When the opening 210 of the rotatable plate 200 is not aligned with the lower end (as shown) of a piston 180, the upper surface (as shown) of the respective segment 140 is extended from the surface of the vacuum platform 130 to the die gripper 170.

Figure 3:
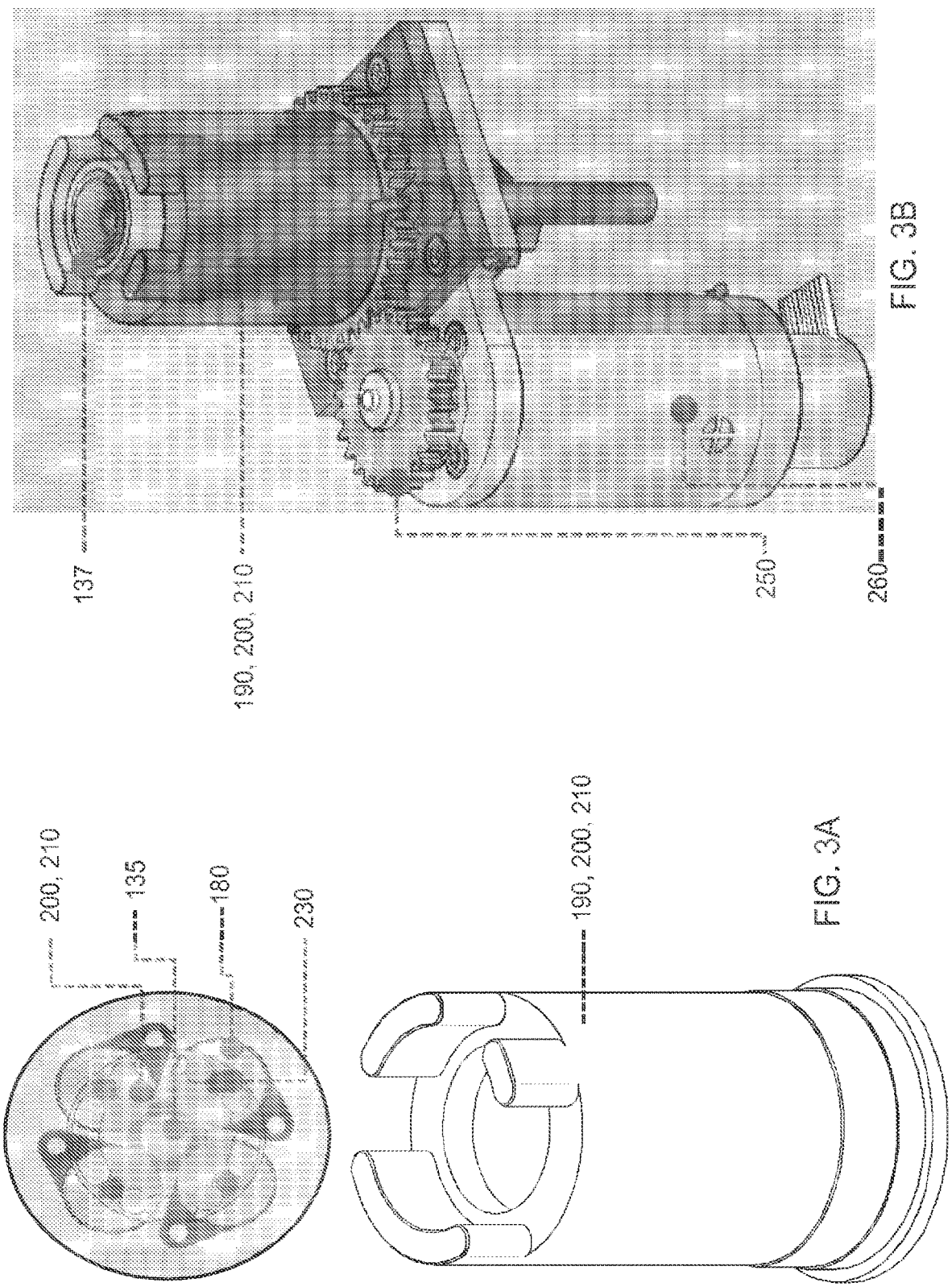
FIG. 3A shows an example of a selector.
FIG. 3B shows a perspective view of a selector.

FIG. 3A shows an example of a selector 190 that may be used with the vacuum platform 130 shown in FIG. 2, and FIG. 3B shows an example of how the selector 190 may be driven (rotated). The selector 190 is configured and arranged to engage a piston pin 230 at the lower end (as shown in FIG. 2) of each piston 180. This means that the selector 190 at the end of the vacuum platform 130 is furthest away from the die gripper 170 (not shown).

FIG. 3B shows a perspective view of selector 190 and above it a cross-sectional view showing how selector 190 dictates which piston 180 and segment 140 is extended towards die gripper 170 (not shown). The selector 190 is approximately cylindrical and comprises a rotatable plate 200 arranged at the end of the selector 190 which is closest to the compressions springs 220 of the vacuum platform 130. In this example, the selector 190 is a rotating cylinder, and the rotatable plate 200 is the upper (as shown) part of the cylinder. The rotatable plate 200 has two or more openings 210—these are configured and arranged so that there are selectable rotational positions at which each piston 180 (and each segment 140) may be independently extended towards the die gripper 170. In this example, each end of the piston 180 closest to the compression spring 220 includes an attached pin as piston pin 230, which, when properly aligned, may pass through the openings 210. The side walls of the openings 210 may easily be tapered to allow longitudinal movement of the pistons 180 when the selector 190 (and the rotatable plate 200) are rotated about the vertical axis (as shown).

The vacuum supply 135 of the vacuum platform 130 is provided by an appropriately configured vacuum suction cup 137, which is arranged in the longitudinal axis in the middle of the selector 190.

The cylindrical design of the selector 190 is configured and arranged in such a way that it may be rotated between different revolutions by means of a gear wheel. An electric motor 260 is equipped with a gear wheel 250, configured and arranged to engage the gear wheel of the selector 190. Preferably a DC motor is used. It may also be advantageous to provide a measuring system, such as an encoder, so that the rotatable plate 200 and the openings 210 may be aligned sufficiently accurately and with high repeat accuracy.

The cross-section shown in FIG. 3A shows a relative orientation of the pistons 180, the rotating plate 200, the openings 210 and the piston pins 230. In the rotating plate 200 and openings 210 shown, all four pistons 180 and therefore all segments (not shown) are extended towards the die gripper. In other words, in this rotary position no opening 210 is aligned with a piston pin 230 of a piston 180 and the pistons remain preloaded by the compression springs 230.

FIG. 4 shows in the lower half, the operation of selector 190 (and in particular the rotatable plate 210) at different rotary positions 310, 320, 330, 340, with the associated wafer mappings W10 to rotary position 310, W20 to rotary position 320, W30 to rotary position 330 and W40 to rotary position 340 shown in the upper part, so that different segments 140 (not shown) may be extended towards die gripper 170 (not shown). Four rotary positions 310, 320, 330, 340 each show the relative orientation of the pistons 180, the rotatable plate 200, the openings 210 and the piston pins 230 in cross-section.

In the upper half of the FIG. 4, the wafer mappings captured by a detector 160 or previously provided are displayed as detection process 1600. In each of the wafer mappings W10, W20, W30, W40, four attachment positions 120 are displayed and designated as top right, top left, bottom right and bottom left. Each of these items is assigned to a segment 140, which is also referred to in the description as top right, top left, bottom right and bottom left.

In this example, the method is designed and adapted to extend segments 140 (not shown) assigned to attachment positions 120 where a die 150 is detected—see 1600.

In situation 310, four dies 150 are detected at the attachment positions 120. The rotating plate 200 is rotated so that none of the piston pins 230 is aligned with one or more openings 210. This is the same rotary position as shown in the cross-section of FIG. 3A. In other words, all four segments are selected by selector 190, all four segments are extended to die gripper 170 and all four dies 150 are replaced. The rotating position of the rotating plate 200 is nominally +27 degrees.

In situation 320, only two dies 150 (bottom right and top left, as shown) are detected at the attachment positions 120. The rotatable plate 200 is rotated so that only two of the piston pins 230 are aligned with one or more openings 210 (top right and bottom left, as shown). In other words, two segments 140 are selected (bottom right and top left, as shown) and these two segments 140 are extended towards the die gripper 170, and all associated dies 150 (bottom right and top left, as shown) are removed. The other two segments 140 are not selected (top right and bottom left as shown), and these two segments 140 remain approximately coplanar with the surface of the vacuum platform 130 (not shown). The rotating position of the rotating plate 200 is nominally +45 degrees.

In situation 330, only one die 150 (top left, as shown) is detected at the attachment positions 120. The rotatable plate 200 is rotated so that three of the piston pins 230 are aligned with one or more openings 210 (top right, bottom right and bottom left, as shown). This means that a segment 140 is selected (top left, as shown) and this segment 140 is extended towards the die gripper 170 and the corresponding die 150 (top left, as shown) is replaced. The other three segments 140 are not selected (top right, bottom right and bottom left as shown), and these three segments 140 remain approximately coplanar with the surface of the vacuum platform 130 (not shown). The rotating position of the rotating plate 200 is nominally +63 degrees.

In situation 340, only three dies 150 (top right, bottom right, and bottom left, as shown) are detected at attachment positions 120. The rotatable plate 200 is rotated so that only one of the piston pins 230 is aligned with one or more openings 210 (top left, as shown). In other words, three segments 140 are selected (top right, bottom right and bottom left, as shown) and these three segments 140 are extended towards the die gripper 170, and all associated dies 150 (top right, bottom right and bottom left, as shown) are removed. The remaining segment 140 is not selected (top left, as shown), and this segment 140 remains approximately coplanar with the surface of the vacuum platform 130 (not shown). The rotating position of the rotating plate 200 is nominal +9 degrees.

Although four segments 140 are shown in the examples and drawings, the invention offers the advantage of high throughput even with fewer segments 140 such as two, three or four segments 140 which are independently extendable. Since the vacuum platform 130 as shown in FIG. 2 and the selector 190 shown in FIGS. 3A and 3B are separate units from each other, it may be advantageous to provide a vacuum platform 130 with a different number of independently extendable segments 140—the fixture 100 may then be quickly modified by replacing the vacuum platform 130 for different operating modes.

Any number of segments 140 may be used, e.g. six, eight, ten or more. A vacuum platform 130 may be operated with fewer segments 140—for example, a vacuum platform with four segments may be operated in a two-segment mode, where the adhesive film must be repositioned after the one or more dies 150 in the two attachment positions 120 have been removed.

Figure 5:
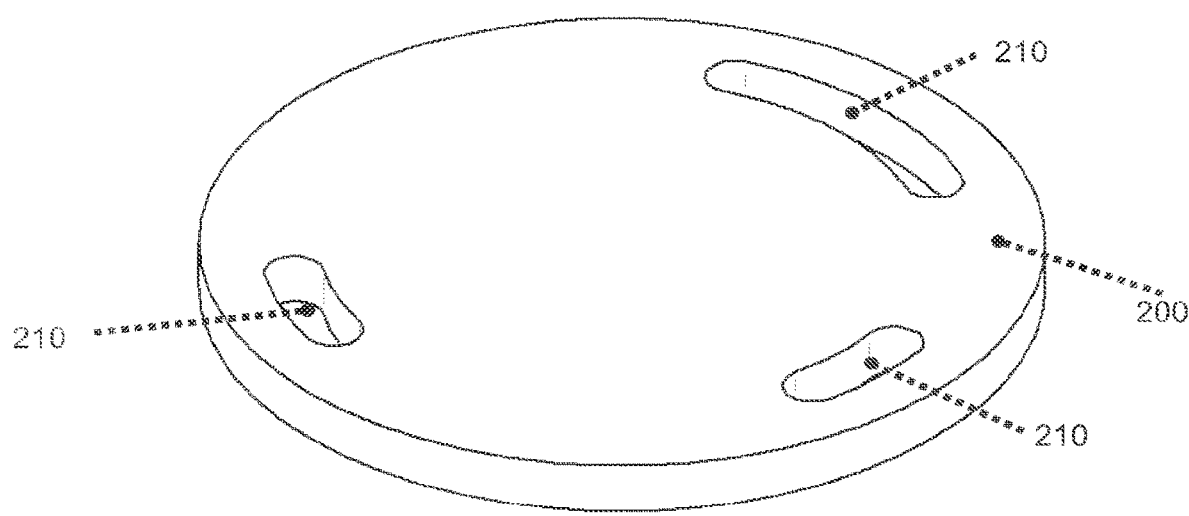
FIG. 5 shows a detailed representation of the preferred design of a rotating plate made of FIG. 4.

FIG. 5 shows a detailed representation of the preferred design of a rotating plate 190 with several different openings 210 from FIG. 4.

| LIST OF REFERENCE NUMERALS | |
| --- | --- |
| No. | Definition |
| 100 | die-ejecting apparatus |
| 110 | adhesive film |
| 120 | die-sized attachment positions |
| 130 | vacuum platform |
| 135 | vacuum supply |
| 137 | vacuum cups |
| 140 | segment |
| 150 | die |
| 160 | die detector |
| 170 | die gripper |
| 175 | die gripper head |
| 180 | piston |
| 185 | guide cylinder |
| 190 | selector |
| 200 | rotatable plate |
| 210 | opening |
| 220 | compushion spring |
| 230 | piston pin |
| 250 | gear wheel for rotatable plate adjustment |
| 260 | electrical motor |
| 310 | 4 dies detected, rotation to +27 degrees |
| 320 | 2 dies detected, rotation to +45 degrees |
| 330 | 1 die detected, rotation to +63 degrees |
| 340 | 3 dies detected, rotation to +9 degrees |
| W10 | wafer mapping for 310 |
| W20 | wafer mapping for 320 |
| W30 | wafer mapping for 330 |

| LIST OF REFERENCE NUMERALS | |
|---|---|
| No. | Definition |
| W40 | wafer mapping for 340 |
| 1600 | wafer mapping captured or previously provided by a detector 160 |

The invention claimed is:

1. An apparatus (100) for detaching a die (150) from an adhesive film
 (110) having two or more adjacent die-sized attachment positions (120), the apparatus comprising:
 a vacuum platform (130) having a surface for supporting and holding the adhesive film (110) on which the die (150) is disposed;
 a die gripper (170) for releasably attaching to dies (150);
 the vacuum platform (130) having two or more segments (140) independently extendable relative to the surface of the vacuum platform (130) to push against the adhesive film (110) at a respective attachment position (120) towards the die gripper (170);
the apparatus further comprising:
 a die detector (160), configured to detect the attachment position (120) at which the die (150) is mounted;
 a controller configured to extend a segment of the two or more segments (140) proximate the attachment position (120) to push the die (150) towards the die gripper (170), and further configured to move the die gripper (170) to attach to the die (150);
 wherein the vacuum platform (130) further comprises a piston (180) and a selector (190), wherein the piston (180) is configured to extend the two or more segments (140) towards the die gripper (170); and wherein the selector (190) is configured to select one or more segments (140) by resisting displacement of one or more pistons (180) or allowing displacement of one or more pistons (180), and wherein the piston (180) is configured to extend the two or more segments (140) towards the die gripper (170);
 wherein the selector (190) further comprises a rotatable plate (200) having one or more openings arranged and configured to select one or more segments (140) from all segments by rotating the rotatable plate so that the pistons (180) extend the remaining segments (140) due to the one or more openings.

2. The apparatus according to claim 1, wherein the adhesive film (110) has four attachment positions (120) and the vacuum platform (130) has four segments (140), each of the segments (140) being independently extendable to push against the adhesive film (110) at the respective attachment positions (120).

3. The apparatus according to claim 1, the vacuum platform (130) further comprising two or more pistons (180), each piston (180) configured to extend the respective segment (140) independently towards the die gripper (170).

4. The apparatus according to claim 3, wherein the vacuum platform (130) comprises four pistons (180), each piston (180) being configured to extend the respective segment (130) independently towards the die gripper (170).

5. The apparatus of claim 1, wherein the selector (190) is configured to resist movement of a segment (140), preferably of two or three segments (140), towards the die gripper (170).

6. The apparatus according to claim 1, the die gripper (170) comprising two or more die gripper heads (175), each die gripper head (175) being movable to attach to the die (150) at the respective attachment position (120).

7. The apparatus according to claim 6, wherein the die gripper (170) comprises four die gripper heads (175), each die gripper head (175) being movable to attach to the die (150) at the respective attachment position (120).

8. A system for equipping electronic assemblies with semiconductor components (150) comprising the apparatus (100) for ejecting dies (150) from the adhesive film (110) according to claim 1.

\* \* \* \* \*